United States Patent
Kim et al.

(10) Patent No.: US 6,801,349 B2
(45) Date of Patent: Oct. 5, 2004

(54) IMPLEMENTATION METHOD OF AN ALL-OPTICAL HALF ADDER BY USING SOA-BASED DEVICES AND AN APPARATUS THEREOF

(75) Inventors: Jae Hun Kim, Seoul (KR); Young Tae Byun, Gyunggi-do (KR); Young Min Jhon, Seoul (KR); Seok Lee, Seoul (KR); Deok Ha Woo, Seoul (KR); Sun Ho Kim, Gyunggi-do (KR)

(73) Assignee: Korea Institute of Science and Technology, Seoul (KR)

( * ) Notice: Subject to any disclaimer, the term of this patent is extended or adjusted under 35 U.S.C. 154(b) by 92 days.

(21) Appl. No.: 10/192,208

(22) Filed: Jul. 9, 2002

(65) Prior Publication Data

US 2003/0090784 A1 May 15, 2003

(30) Foreign Application Priority Data

Nov. 14, 2001 (KR) .......................................... 2001-70655

(51) Int. Cl.$^7$ ................................................ G02F 3/00
(52) U.S. Cl. ........................................ 359/108; 359/344
(58) Field of Search .................................. 359/108, 344

(56) References Cited

U.S. PATENT DOCUMENTS

| | | | |
|---|---|---|---|
| 5,999,283 A | * 12/1999 | Roberts et al. | 359/108 |
| 5,999,284 A | * 12/1999 | Roberts | 359/108 |
| 6,151,428 A | * 11/2000 | Vahala et al. | 385/11 |
| 6,462,865 B1 | * 10/2002 | Chu et al. | 359/344 |
| 6,647,163 B2 | * 11/2003 | Song | 385/15 |
| 2002/0001112 A1 | * 1/2002 | Song | 359/107 |
| 2002/0054404 A1 | * 5/2002 | Hedekvist et al. | 359/108 |
| 2003/0058527 A1 | * 3/2003 | Kim et al. | 359/344 |

\* cited by examiner

*Primary Examiner*—Nelson Moskowitz
*Assistant Examiner*—Deandra M. Hughes
(74) *Attorney, Agent, or Firm*—Harness, Dickey & Pierce, P.L.C.

(57) ABSTRACT

The present invention relates to an implementation method of all-optical half adder by using semiconductor optical amplifier(SOA)-based devices and the apparatus thereof. In more detail, it relates to an implementation method of all-optical half adder comprising an all-optical XOR gate and an all-optical AND gate, implemented by using SOA-based devices, and an apparatus thereof.

6 Claims, 5 Drawing Sheets

IMPLEMENTATION METHOD OF AN ALL-OPTICAL HALF ADDER BY USING SOA-BASED DEVICES AND AN APPARATUS THEREOF

BACKGROUND OF THE INVENTION

1. Field of the Invention

The present invention relates to an implementation method of all-optical half adder by using semiconductor optical amplifier (SOA)-based devices and the apparatus thereof. In more detail, it relates to an implementation method of all-optical half adder comprising an all-optical XOR gate and an all-optical AND gate, implemented by using SOA-based devices, and an apparatus thereof.

2. Description of the Related Art

Demand of high-speed and large-scale of a communication system is recently being increased, however, most of currently used communication systems based on silicon (Si) material (i.e. based on electric signal) have limitations in their operation speed and information handling capacity. And thus, the future performance of this type of communication system is questionable.

On the other hand, a communication system using optical devices based on indium phosphide (InP) can solve the problems of operation speed and information handling capacity described above.

Generally, a communication system is constituted by integrating various single gates such as AND, OR, XOR, NAND, NOR, and NXOR. And, so is the communication system using optical devices. As the complexity of the communication system increases, the multiple operations of logic gates are required.

A half adder is a basic example of a communication element carrying out the complex and multiple operations.

A half adder is a computation element in which both an XOR logic operation and an AND logic operation are being carried out simultaneously.

Recently, many researches are being concentrated on the development of XOR gates such as an XOR using an ultrafast nonlinear interferometer (UNI)(C. Bintjas, M. Kalybas, G. Theophilopoulos, T. Stathopoulos, H. Avramopoulos, L. Occhi, L. Schares, G. Guekos, S. Hansmann and R. Dall'Ara, *IEEE Photonics Technology Letters*, vol. 12, no. 7, pp. 834–836, 2000), an XOR using a terahertz optical asymmetric demultiplexer (TOAD)(Pousite, Blow, Kelly, Manning, *Opt. Commun.*, 156, pp. 22–26, 1998), an XOR using a Sagnac gate (T. Houbavlis, Zoiros, A. Hatziefremidis, H. Avramopoulos, L. Occhi, G. Guekos, S. Hansmann, H. Burkhard and R. Dall'Ara, *Electronics Letters*, vol. 35, no. 19, pp. 1650–1652, 1999) and an XOR using an interferometric wavelength converter (IWC) (T. Fjelde, D. Wolfson, A. Kloch, B. Dagens, A. Coquelin, I. Guillemot, F. Gaborit, F. Poingt and M. Renaud, *Electronics Letters, vol.* 36, no. 22, pp. 1863–1864, 2000).

Various researches have also been made on AND gates such as an AND using an electro-absorption modulator (EAM) (E. Awad, P. Cho and J. Goldhar, *IEEE Photonics Technology Letters*, vol. 13, no. 5, 2001), an AND using a nonlinear optical loop mirror (NOLM) (B. Olsson and P. Andrekson, *Optical Fiber Communication Conference and Exhibit, Technical Digest*, pp. 375–376, 1998) and an AND using a four-wave mixing (D. nesset, M. C. Tatham and D. Cotter, *Electronics Letters, vol.* 31, no. 11, pp. 896–897, 1995).

Logic gates using a UNI, a TOAD, or a Sagnac gate as described above have an advantage of high operation speed. However, the key components of these systems are optical fibers that are complicated and hard to be integrated with other devices, and thus, they have difficulties in being applied to an optical computation system requiring a highly integrated circuit.

And, an implementation method using a four-wave mixing has a problem that it is hard to control the polarization state of a signal.

Compared with these systems described above, optical gates using a single semiconductor optical amplifier (SOA) have advantages that they are stable, providing a small system size, easy to be combined with other optical devices, and providing a possible polarization- and wavelength-independency (Fjelde, Wolson, Kloch, Janz, Coquelin, Guillemot, Gaborit, Poingt, Dagens and Renaud, *Electronics Letters*, vol. 36, no. 9, 2000).

SUMMARY OF THE INVENTION

The present invention is proposed to solve the problems of the prior art mentioned above. It is therefore the object of the present invention to provide an implementation method of all-optical half adder by using SOA-based devices, which is stable, providing a small system size, easy to be combined with other optical devices, and providing a possible polarization- and wavelength-independency, by implementing an all-optical XOR gate using the cross-gain modulation (XGM) characteristic of SOA and an all-optical AND gate using a SOA-based cross-phase modulation (XPM) wavelength converter, and an apparatus thereof.

To achieve the object mentioned above, the present invention presents an implementation method of all-optical half adder by using SOA-based devices characterized in that SUM signal is outputted by adding the output signals of the XGM characteristics produced by gain-saturation and wavelength conversion of two semiconductor optical amplifiers (SOAs) by injecting both pump signal and probe signal together into each SOA in the different way; and CARRY signal, of which the power of output signal is being increased by simultaneously injecting a high-power probe signal into an XPM wavelength converter with varying a pump signal and the power of output signal is being decreased by simultaneously injecting a low-power probe signal into an XPM wavelength converter with varying a pump signal, is outputted.

To achieve the object mentioned above, the present invention presents an all-optical half adder comprising: a fiber ring laser and a pulse generator for generating a pulse signal having a certain interval; a coupler for being injected by a pulse signal and dividing the injected pulse signal; an optical delay for delaying one part of divided signal; a coupler for producing an A-signal having 1100 pattern by combining the delayed signal and the other part of divided signal; an optical delay for producing a B-signal having 0110 pattern by delaying the A-signal; the first semiconductor optical amplifier (SOA1) for being injected by A-signal as a probe signal and B-signal as a pump signal and outputting a Boolean A $\overline{B}$ logic signal; the second semiconductor optical amplifier (SOA2) for being injected by A-signal as a pump signal and B-signal as a probe signal and outputting a Boolean $\overline{A}B$ logic signal; and a cross-phase modulation (XPM) wavelength converter for simultaneously being injected by A-signal and B-signal and outputting a logic signal having 0100 pattern.

An all-optical XOR gate in accordance with the present invention is implemented by using the XGM characteristics of two semiconductor optical amplifiers (SOAs). As seen in the experimental setup, it is independent of a clock signal and/or a CW signal since the XOR gate uses only input signals A and B.

Therefore, as long as the speeds of A-signal and B-signal, which are inputted into the two semiconductor optical amplifiers (SOAs), are the same, an element can be implemented without a clock signal and/or a CW signal.

In addition, an XOR gate in accordance with the present invention firstly produces a Boolean $A\overline{B}$ signal and a Boolean $\overline{A}B$ signal, and summates them thereafter. Therefore, various logic signals can be generated by using only one all-optical XOR gate since $A\overline{B}$ signal and $\overline{A}B$ signal can be separated.

DETAILED DESCRIPTION OF THE EMBODIMENTS

As described above, the present invention is characterized in that SUM signal is outputted by adding the output signals of inverter characteristic produced by gain-saturation and wavelength conversion of semiconductor optical amplifier (SOA) by injecting both pump signal and probe signal together into each semiconductor optical amplifier; and CARRY signal, of which the power of output signal is being increased by simultaneously injecting a high-power probe signal into an XPM wavelength converter with varying a pump signal and the power of output signal is being decreased by simultaneously injecting a low-power probe signal into an XPM wavelength converter with varying a pump signal, is outputted.

Hereinafter, referring to appended drawings, the embodiments of the present invention are described in detail.

Figure 1:
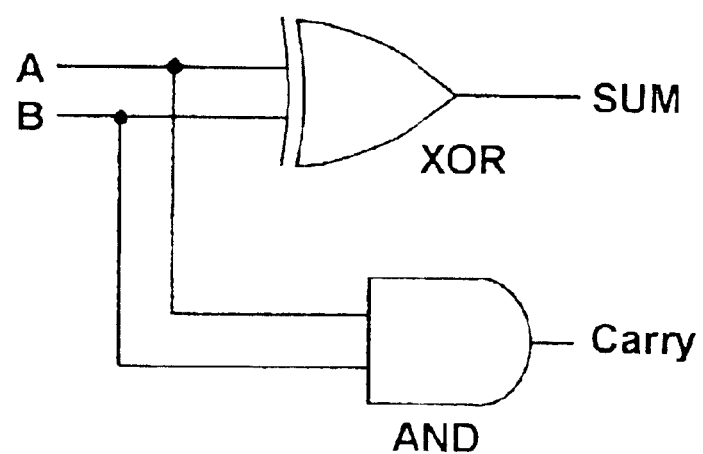
FIG. 1 is a view illustrating the basic concept of the all-optical half adder.

FIG. 1 is a view illustrating the basic concept of a half adder.

A half adder described in FIG. 1 is a system producing the signals of SUM represented by Table 1 and CARRY represented by Table 2. The SUM signal and the CARRY signal are obtained by a simultaneous implementation of the all-optical XOR gate and the all-optical AND gate.

TABLE 1

| A | B | SUM |
|---|---|-----|
| 0 | 0 | 0 |
| 0 | 1 | 1 |
| 1 | 0 | 1 |
| 1 | 1 | 0 |

TABLE 2

| A | B | CARRY |
|---|---|-------|
| 0 | 0 | 0 |
| 0 | 1 | 0 |
| 1 | 0 | 0 |
| 1 | 1 | 1 |

First, looking into the signal regeneration method of an XOR gate producing SUM signal, when pump signal having high-power is injected into an SOA, a carrier-exhaustion is occurred in SOA.

And at the same time, if probe signal is injected therein, gain-saturation is occurred in SOA due to the carrier-exhaustion by the pump signal, and thus, the power of output probe signal is being gradually decreased.

As a result, the output signal has an opposite value of the input signal.

The XGM characteristic of SOA described above produces output signals as described in Table 3 and Table 4 when signal A and signal B is injected into SOA.

In other words, if signal A is injected as probe signal and signal B is injected as pump signal into an SOA, Boolean $A\overline{B}$ can be obtained as described in Table 3.

Similarly, if signal A is injected as pump signal and signal B is injected as probe signal into the other SOA, Boolean $\overline{A}B$ can be obtained as described in Table 4.

TABLE 3

| A | B | $A\overline{B}$ |
|---|---|-----|
| 0 | 0 | 0 |
| 0 | 1 | 0 |
| 1 | 0 | 1 |
| 1 | 1 | 0 |

TABLE 4

| A | B | $\overline{A}B$ |
|---|---|-----|
| 0 | 0 | 0 |
| 0 | 1 | 1 |
| 1 | 0 | 0 |
| 1 | 1 | 0 |

Therefore, an XOR gate having the value of $A\overline{B}+\overline{A}B$ just like SUM in Table 1, can be implemented by adding the output signals of $A\overline{B}$ and $\overline{A}B$.

Figure 2:
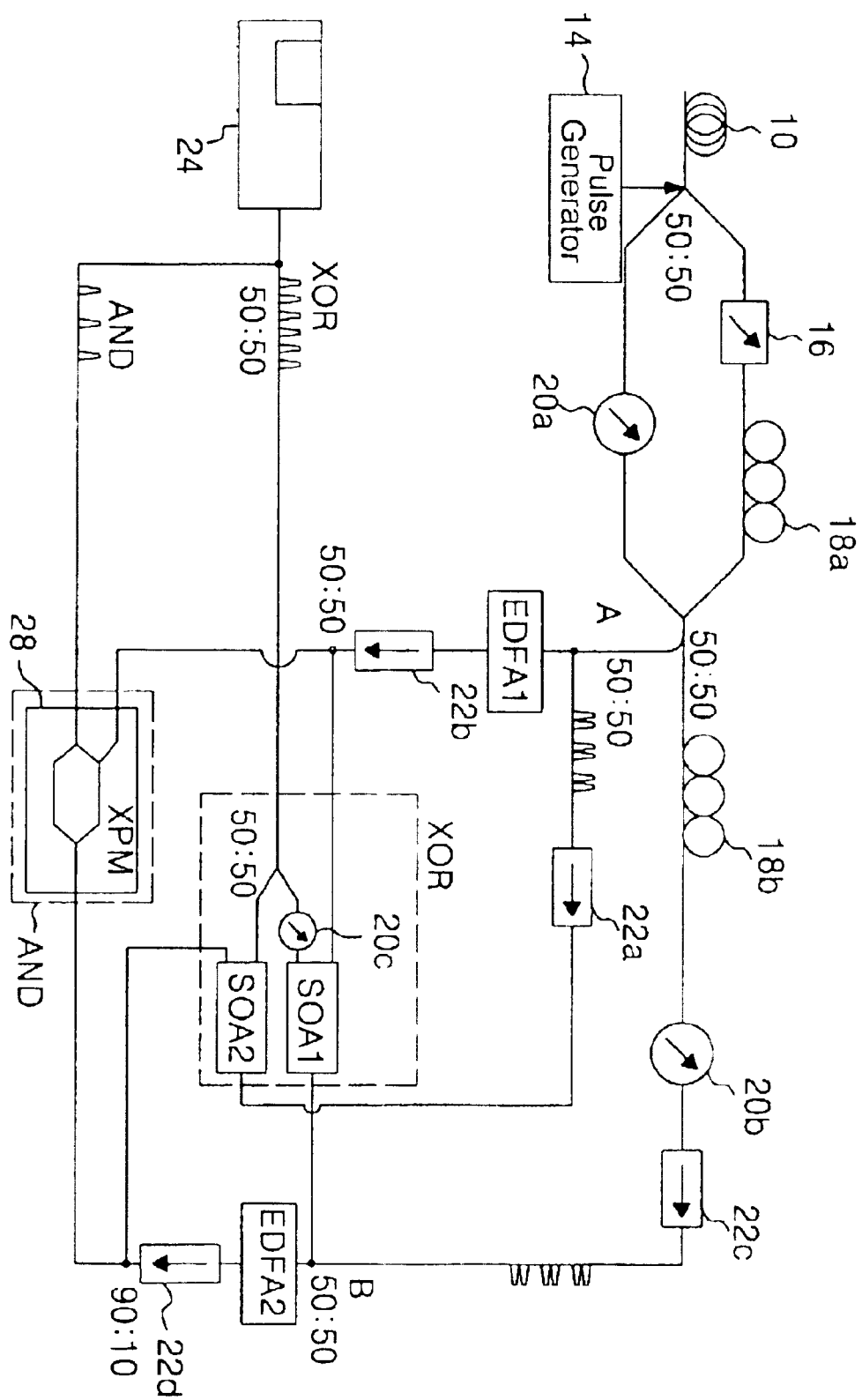
FIG. 2 is a view illustrating the structure of an apparatus for implementing the all-optical half adder in accordance with the present invention.

FIG. 2 is a view illustrating the structure of an embodiment for implementing a half adder comprising an all-optical XOR gate.

First, generate a pulse signal having 400 ps interval by using a fiber ring laser (10) and a pulse generator (14).

After dividing the pulse signal by injecting it into a 50:50 coupler, one part of the divided signal is delayed for 100 ps through an optical delay (20a), and the other part is transmitted through an optical attenuator (16) and a polarization controller (18a). Then, signal A having 1100 pattern is produced by re-combining two divided signals.

As the next step, signal B having 0110 pattern is produced by delaying signal A by 100 ps through a polarization controller (18b) and an optical delay (20b) and transmitting it through an optical isolator (22c) thereafter.

Signal A is injected into the first semiconductor optical amplifier (SOA1) as probe signal through an Erbium-doped fiber amplifier (EDFA1) and an optical isolator (22b), and signal B is injected into SOA1 as pump signal.

On the other hand, signal A is injected into the second semiconductor optical amplifier (SOA2) as pump signal through an optical isolator (22a), and signal B is injected into SOA2 as probe signal through an Erbium-doped fiber amplifier (EDFA2) and an optical isolator (22d).

That is to say, signal A serves as probe signal and signal B serves as pump signal in the first semiconductor optical amplifier (SOA1), and signal A serves as pump signal and signal B serves as probe signal in the second semiconductor optical amplifier (SOA2).

Figure 3:
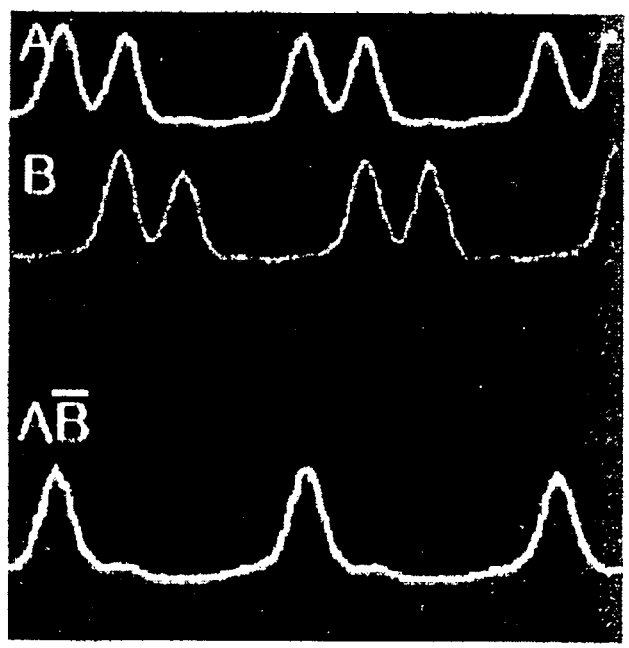
FIG. 3 is the logic signal output screen of Boolean $A\overline{B}$ constituting an XOR gate in accordance with the present invention.
Figure 4:
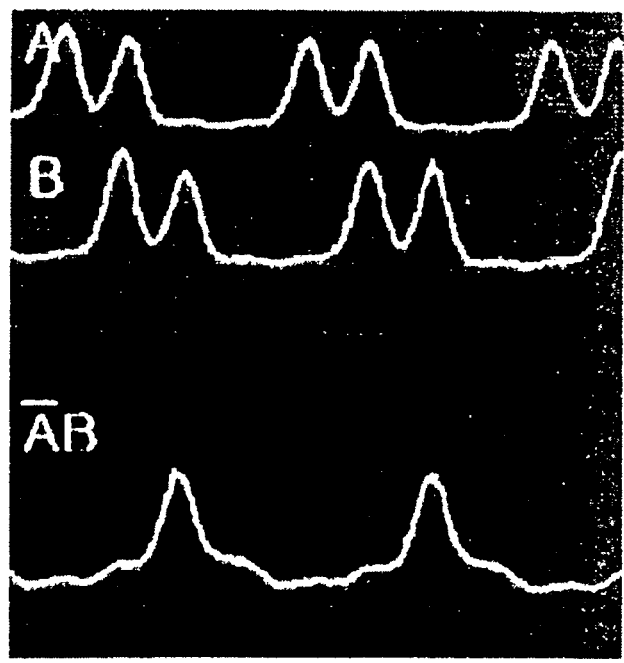
FIG. 4 is the logic signal output screen of Boolean $\overline{A}B$ constituting an XOR gate in accordance with the present invention.
Figure 5:
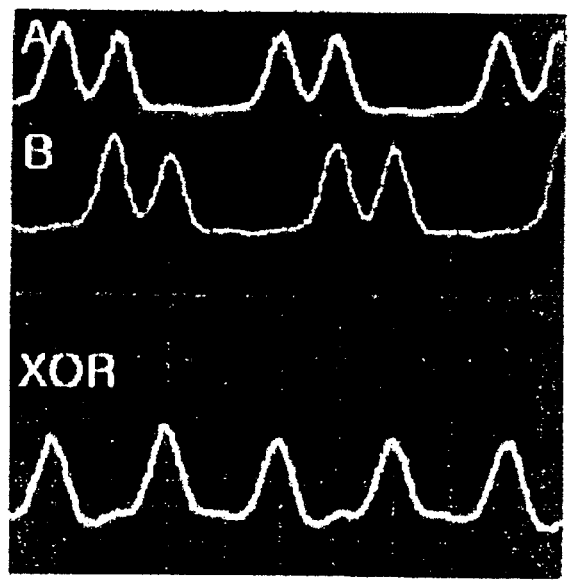
FIG. 5 is the logic signal output screen of an all-optical XOR gate in accordance with the present invention.

Producing Boolean $A\overline{B}$ as described in FIG. 3 by using the first semiconductor optical amplifier (SOA1) and Boolean $\overline{A}B$ as described in FIG. 4 by using the second semiconductor optical amplifier (SOA2) and adding the signals by using a 50:50 coupler, a signal can be obtained by an oscilloscope connected to a signal analyzer (24) as described in FIG. 5.

Here, it can be noticed that the resultant signal is identical to Boolean $A\overline{B}+\overline{A}B$, i.e. the logic table of all-optical XOR gate described in Table 1.

FIG. 5 is a view illustrating the operation characteristic of XOR gate, which is the summation of output signals of SOA2 and SOA2. Referring to FIG. 5, it can be noticed that, when signal A having 1100 pattern and signal B having 0110 pattern are injected into two semiconductor optical amplifiers (SOA2, SOA2) and added thereafter, an output signal having 1010 pattern is produced.

Looking into the output signal, it has the logic value '1' when signal A is '0' and signal B is '1' and when signal A is '1' and signal B is '0'.

And, when both signal A and signal B have the same value, i.e. both signal A and signal B are '0' or both signal A and signal B are '1', the output signal has the logic value '0'.

These results are identical to Table 1, and thus, an implementation of SUM signal of XOR gate is experimentally verified.

Next, looking into the constitutional structure of an AND gate required for implementation of CARRY signal, an all-optical interferometric wavelength converter is used to constitute an all-optical AND gate in accordance with the present invention.

If high-power probe signal is injected into an XPM wavelength converter (28) simultaneously with varying pump signal, the output power is being increased.

Here, define the output signal power before the increase as logic '0' and the increased output signal power as logic '1'.

Similarly, if low-power probe signal is injected in the same way as described above, the output signal power is negligibly low, and thus it is considered to be '0'.

Figure 6:
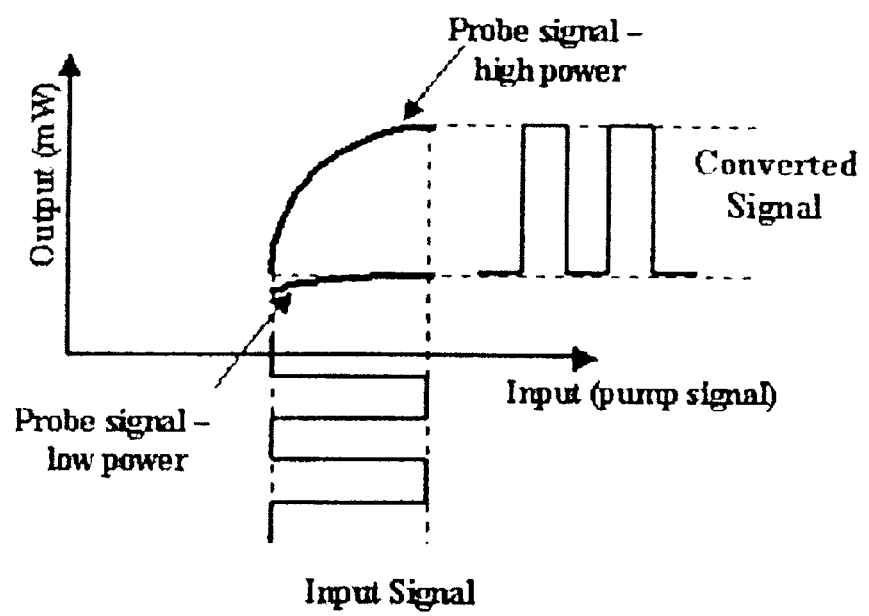
FIG. 6 is a view illustrating the basic concept of an AND gate.

Therefore, in case that pump signal and probe signal having high power are considered to be logic '1' respectively, a signal having high-power is outputted at an output port as described in FIG. 6, and thus, an AND gate can be implemented.

Figure 7:
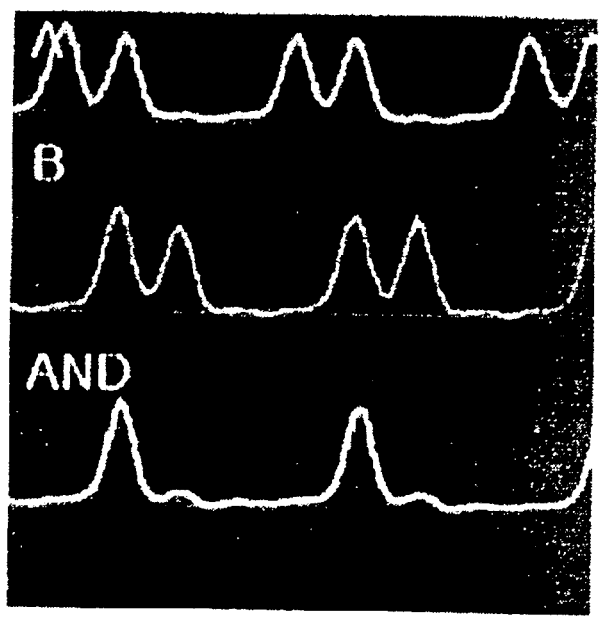
FIG. 7 is the logic signal output screen of an AND gate in accordance with the present invention.

In case that an signal A and a signal B are simultaneously injected into an XPM wavelength converter (28) for producing an AND signal by using an A-signal and a B-signal, which have the same patterns as those for XOR gate in FIG. 2, the output signal variance according to the input signals is obtained as described in FIG. 7.

Here, when an signal A having 1100 pattern and a signal B having 0110 pattern are simultaneously injected, the output signal has 0100 pattern. So, it can be noticed that an AND gate is successfully implemented.

In other words, the output signal is logic '1' only when both signals are logic '1', and otherwise, the output signal is logic '0'.

These results are identical to Table 2, and thus, an implementation of CARRY signal of AND gate is experimentally verified.

Figure 8:
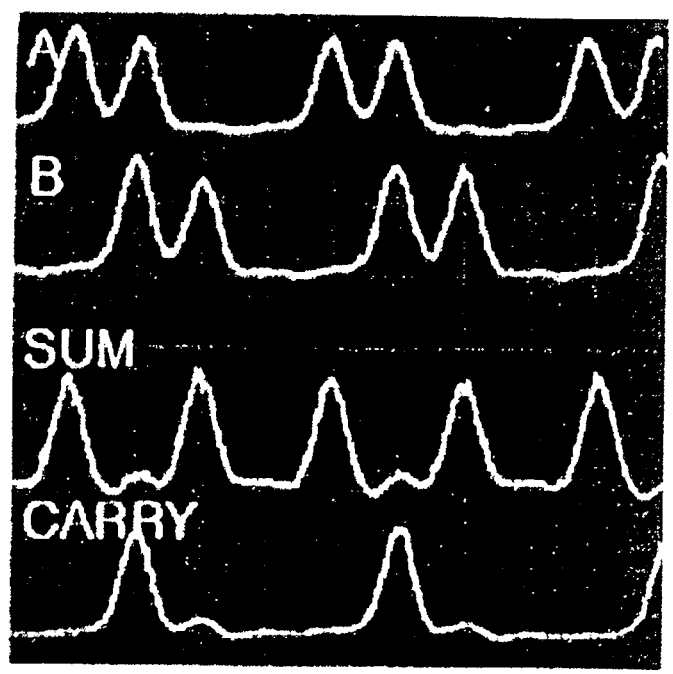
FIG. 8 is the logic signal output screen of a half adder in accordance with the present invention.

FIG. 8 shows the operation characteristics of an apparatus in accordance with the present invention when both SUM signal of XOR gate and CARRY signal of AND gate are implemented together.

Since these results are identical to the results of Table 1 and Table 2, which represent an all-optical half adder, it is needless to say that an all-optical half adder, operating under 10 Gb/s environment, can be also implemented through a logical verification and experiments as described above.

Above described all-optical half adder is a basic key-element of a computation device and required for all kinds of computation process. And thus, it is inevitable for an optical computer implementation.

As mentioned thereinbefore, the present invention provides an all-optical half adder by implementing an all-optical XOR gate using cross-gain modulation (XGM) characteristics of semiconductor optical amplifier (SOA) and an all-optical AND gate using an XPM wavelength converter. Therefore, an all-optical half adder in accordance with the present invention is stable, providing a small system size, easy to be combined with other optical devices, and providing possible polarization- and wavelength-independency.

Since those having ordinary knowledge and skill in the art of the present invention will recognize additional modifications and applications within the scope thereof, the present invention is not limited to the embodiments and drawings described above.

What is claimed is:

1. An implementation method of all-optical half adder by using cross-gain modulation (XGM) and cross-phase modulation (XPM) of semiconductor optical amplifier(SOA)-based devices characterized in that:

SUM signal is outputted by adding the output signals of cross-gain modulation (XGM) characteristics produced by gain-saturation and wavelength conversion of semiconductor optical amplifier(SOA) by injecting both pump signal and probe signal together into each semiconductor optical amplifier (SOA); and CARRY signal, of which the power of output signal is being increased by simultaneously injecting high-power probe signal into a cross-phase modulation (XPM) wavelength converter with varying a pump signal and the power of output signal is being decreased by simultaneously injecting low-power probe signal into an XPM wavelength converter with varying pump signal, is outputted.

2. An implementation method of all-optical half adder by using-XGM and XPM of SOA-based devices as claimed in claim 1, characterized by said pump signal having high-power being injected into said semiconductor optical amplifier(SOA) to cause carrier-exhaustion for gain-saturation to be occurred therein to reduce the signal power of output probe signal, and thereby a signal having XGM characteristics being outputted.

3. An implementation method of all-optical half adder by using XGM and XPM of SOA-based devices as claimed in claim 1, characterized in that probe signal injected into one of said two semiconductor optical amplifiers(SOAs) serves as pump signal for the other SOA and pump signal injected into said one of said two semiconductor optical amplifiers(SOAs) serves as probe signal for the other SOA.

4. An implementation method of all-optical half adder by using XGM and XPM of SOA-based devices as claimed in claim 1, characterized in that probe signal and pump signal injected into said XPM wavelength converter are the same probe signal and pump signal injected into said two semiconductor optical amplifiers(SOAs).

5. An implementation apparatus of all-optical half adder by using semiconductor optical amplifier(SOA)-based devices comprising:

a fiber ring laser and a pulse generator for generating a pulse signal having a certain interval;

a coupler for being injected by said pulse signal and dividing said pulse signal;

an optical delay for delaying one part of said divided signal;

a coupler for producing an A-signal having 1100 pattern by combining said delayed signal and the other part of said divided signal;

an optical delay for producing a B-signal having 0110 pattern by delaying said A-signal;

the first semiconductor optical amplifier(SOA1) for being injected by said signal A as probe signal and said signal B as pump signal and outputting Boolean $A\overline{B}$ logic signal;

the second semiconductor optical amplifier(SOA2) for being injected by said signal A as pump signal and said signal B as probe signal and outputting Boolean $\overline{A}B$ logic signal; and a cross-phase modulation(XPM) wavelength converter for simultaneously being injected by said signal A and said signal B and outputting a logic signal having 0100 pattern.

6. An implementation apparatus of all-optical half adder by using SOA-based devices as claimed in claim 5, characterized in that said pulse signal generated by said fiber ring laser and said pulse generator has 400 ps interval, and it is delayed by 100 ps by said optical delay.

* * * * *